(12) United States Patent
Gailhard

(10) Patent No.: US 10,908,192 B2
(45) Date of Patent: Feb. 2, 2021

(54) MONITORING OF A DC VOLTAGE VALUE WITH RESPECT TO SEVERAL VOLTAGE LEVELS

(71) Applicant: STMicroelectronics (Rousset) SAS, Rousset (FR)

(72) Inventor: Bruno Gailhard, Rognes (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/570,527

(22) Filed: Sep. 13, 2019

(65) Prior Publication Data
US 2020/0103928 A1    Apr. 2, 2020

(30) Foreign Application Priority Data
Sep. 27, 2018    (FR) ...................................... 18 58920

(51) Int. Cl.
*G01R 19/165*    (2006.01)
*G06F 1/28*    (2006.01)

(52) U.S. Cl.
CPC . *G01R 19/16552* (2013.01); *G01R 19/16528* (2013.01); *G06F 1/28* (2013.01)

(58) Field of Classification Search
CPC ............ G01R 19/165; G01R 19/16504; G01R 19/16528; G01R 19/16533; G01R 19/16552; G01R 19/16566; G01R 19/16576; G01R 19/1659; G01R 19/16595; G06F 1/28
USPC ..................................................... 327/1, 530
See application file for complete search history.

(56) References Cited

U.S. PATENT DOCUMENTS

| | | | |
|---|---|---|---|
| 7,005,894 B2* | 2/2006 | Weder .................. | G01R 19/165 327/74 |
| 2005/0174249 A1 | 8/2005 | Weder | |
| 2007/0150217 A1 | 6/2007 | Sasazaki | |
| 2012/0025805 A1* | 2/2012 | Matsushita ...... | G01R 19/16542 324/76.11 |
| 2013/0027089 A1 | 1/2013 | Huang | |
| 2015/0022240 A1* | 1/2015 | Soraoka ........... | G01R 19/16552 327/76 |

FOREIGN PATENT DOCUMENTS

WO    2018160578 A1    9/2018

* cited by examiner

*Primary Examiner* — William Hernandez
(74) *Attorney, Agent, or Firm* — Slater Matsil, LLP

(57) ABSTRACT

A method includes selecting at least one first voltage that defines subsets of DC voltages from among an ordered set of DC voltages, comparing the first voltage with a DC reference voltage, selecting one of the subsets based on a result of the comparing, and comparing each voltage of the selected subset with the reference voltage.

20 Claims, 4 Drawing Sheets

MONITORING OF A DC VOLTAGE VALUE WITH RESPECT TO SEVERAL VOLTAGE LEVELS

CROSS-REFERENCE TO RELATED APPLICATIONS

This application claims priority to French Patent Application No. 1858920, filed on Sep. 27, 2018, which application is hereby incorporated herein by reference.

TECHNICAL FIELD

The present disclosure generally relates to electronic circuits and, in particular embodiments, to the monitoring of a DC voltage value with respect to several voltage levels.

BACKGROUND

Circuits, particularly integrated circuits, comprising portions, also called cells, in each of which the value of a same main DC voltage of the circuit determines whether the cell operates properly or not, are known. In particular, each cell is associated with at least one voltage level, capable of differing from one cell to another, such that, when the main voltage of the circuit diverges from its nominal value and reaches this level, the concerned cell can no longer operate properly.

SUMMARY

Embodiments relate to circuits where, according to the value of the same DC voltage, portions of the circuit have a correct or incorrect operation.

Embodiments can estimate the value of a main DC voltage of a circuit with respect to a plurality of voltage levels, for example, so that each of these levels determines the proper operation of a corresponding cell of the circuit.

An embodiment overcomes all or part of the disadvantages of known methods and/or devices of estimation of the value of a DC voltage with respect to a plurality of voltage levels.

An embodiment provides a method comprising the successive steps of: a) selecting at least one first voltage from among an ordered set of DC voltages, the first voltage defining subsets of DC voltages, b) comparing the first voltage with a reference DC voltage, c) selecting one of the subsets according to the result of step b), and d) comparing each voltage of the selected subset with the reference voltage.

According to an embodiment, before step d), steps a), b), and c) are repeated, preferably recursively.

According to an embodiment, the subset of step d) is the subset selected at the last iteration of step c).

According to an embodiment, steps a), b), and c) are repeated until the subsets defined at step a) comprise at most one voltage.

According to an embodiment, the method further comprises, after step d), a step e) comprising determining, based on the comparisons, two of the DC voltages surrounding the reference voltage.

According to an embodiment, the method further comprises, after step e), a step comprising estimating a level of each of the DC voltages based on the reference voltage and on the two voltages.

According to an embodiment, the DC voltages are obtained from a main DC voltage, the method preferably comprising, after step e), a step of estimating the value of the main DC voltage with respect to voltage levels, each of which is defined by one of the DC voltages and by the reference voltage.

According to an embodiment, at step a), the subsets defined by the first voltage comprise a same number of DC voltages, plus or minus one.

According to an embodiment, the subset selected at step c) comprises only voltages greater than the first voltage or only voltages smaller than the first voltage.

Another embodiment provides a device comprising: a first circuit of selection of at least one first voltage from among an ordered set of DC voltages, the first voltage defining subsets of DC voltages; at least one first comparator of the first voltage with a reference voltage, the first circuit being further configured to select one of the subsets based on the output signal of the first comparator; and at least one second comparator configured to compare each voltage of the selected subset with the reference voltage.

According to an embodiment, the first circuit is configured to select a plurality of first voltages and a plurality of subsets defined by the first voltages, the device comprising a first comparator for each selected first voltage, the first circuit selecting the subsets based on the output signals of the first comparators.

According to an embodiment, the first circuit and the second comparator are configured to compare the reference voltage with each voltage of a single one of the selected subsets.

According to an embodiment, the device further comprises a second circuit, preferably a resistive voltage dividing bridge, configured to generate the DC voltages from a main voltage.

According to an embodiment, the device further comprises a third circuit configured to determine, based on the output signals of the comparators, two of the DC voltages surrounding the reference voltage.

According to an embodiment, the device is capable of implementing the above-defined method.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
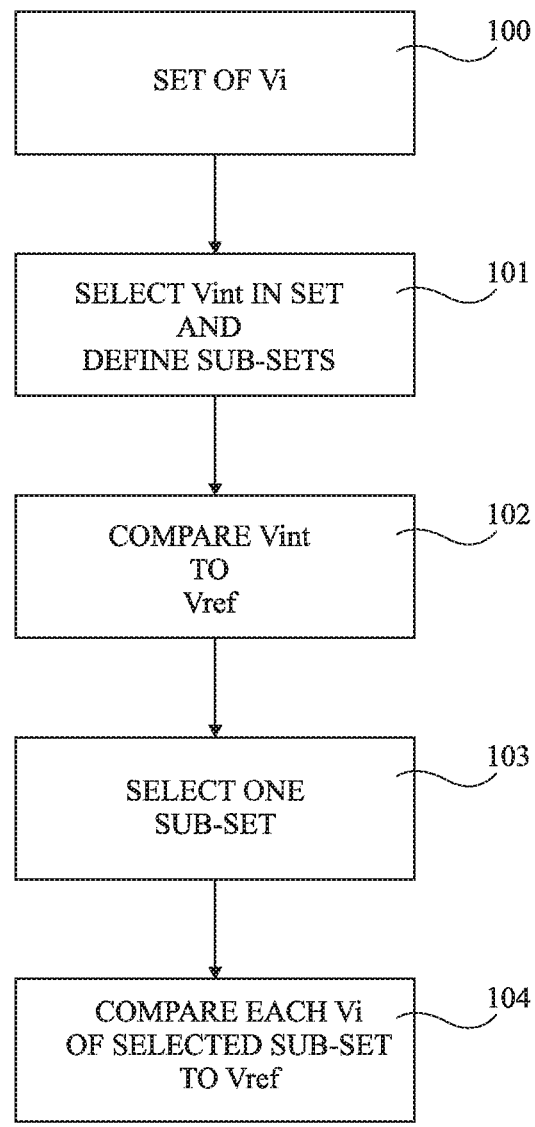
FIG. 1 shows, in the form of blocks, steps of an embodiment of a method of estimating the value of a DC voltage with respect to a plurality of voltage levels.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the electronic circuits where the described embodiments may be provided have not been detailed, these embodiments being compatible with usual electronic circuits.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

In the rest of the description, "DC voltage" preferably means a voltage having a value expected to be constant or substantially constant. However, in practice, the value of a DC voltage may diverge from its nominal value, in particular when this DC voltage is supplied by a cell or a battery.

FIG. 1 shows, in the form of blocks, steps of an embodiment of a method of estimation of the value of a DC voltage with respect to a plurality of voltage levels.

At an initial step 100 (block SET OF Vi), a set of N different DC voltages Vi is provided, i being an integer in the range from 1 to N, N being for example greater than or equal to 2, preferably greater than or equal to 3. Voltages Vi are obtained from a same main DC voltage VDD, preferably a power supply voltage, for example, a voltage VDD having a nominal value substantially equal or equal to 3.3 V. Further, for each voltage Vi, coefficient Ai such that voltage Vi is substantially equal, preferably equal, to the product of voltage VDD by coefficient Ai, is known. Thus, the N voltages Vi form an ordered set, that is, a set of voltages where, for any pair of voltages of the set, that of the voltages in the pair which is greater than the other is known. In other words, the N voltage Vi of the set are classified by order of increasing values or by order of decreasing values with their indexes. As will be shown in further detail hereafter, each voltage Vi defines a different voltage level with respect to which the value of voltage VDD is desired to be estimated.

At a next step 101 (block SELECT Vint IN SET AND DEFINE SUB-SETS), at least one intermediate voltage Vint is selected from among voltages Vi. The selected intermediate voltages Vint define subsets of DC voltages Vi in the set of N voltages Vi of step 100. In other words, the selected intermediate voltage(s) separate the set of N voltages Vi into a plurality of subsets. Preferably, each of the subsets comprises a same number of voltages Vi plus or minus one voltage, and a subset may possibly be the empty set and comprise no voltage Vi. Preferably, for each given intermediate voltage Vint, each of the subsets only comprises voltages Vi greater, respectively smaller, than this intermediate voltage. Preferably, each subset of voltages Vi is ordered.

At a next step 102 (block COMPARE Vint TO Vref), each selected intermediate voltage Vint is compared with a substantially constant, preferably constant, reference DC voltage Vref. In other words, the value of voltage Vref is substantially constant, preferably constant, whatever the value of voltage VDD, conversely to voltages Vi, the value of voltage Vref corresponding to its nominal value. The value of voltage Vref is preferably selected to be smaller than the nominal value of the smallest one of voltages Vi. As an example, when it is desired to detect whether the smallest of voltages Vi becomes smaller than a given value, the value of voltage Vref is selected to be substantially equal, preferably equal, to this given value.

At a next step 103 (block SELECT ONE SUB-SET), one of the subsets defined at the previous step 101 is selected according to the result of the comparison(s) of the previous step 102. Preferably, for each intermediate voltage Vint, if voltage Vref is greater than voltage Vint, the selected subset only comprises voltages Vi greater than voltage Vint and, if voltage Vref is smaller than voltage Vint, the selected subset only comprises voltages Vi smaller than voltage Vint.

At a next step 104 (block COMPARE EACH Vi OF SELECTED SUB-SET TO Vref), each of voltages Vi of the subset selected at the previous step 103 is compared with reference voltage Vref.

Due to the fact that the set of the N voltages Vi is an ordered set, the implementation of the above method enables to determine, for each voltage Vi, whether voltage Vi is greater or smaller than voltage Vref, which is representative of an estimation of the value of voltage VDD with respect to the voltage levels defined by voltages Vi. Indeed, one can then determine two successive voltages Vinf and Vsup, for example, at a next step, not shown, from among the ordered set of voltages Vi and, possibly, main voltage VDD and/or the zero voltage, such that voltages Vinf and Vsup surround voltage Vref. In other words, among voltages Vi and, possibly, main voltage VDD and/or the zero voltage, voltage Vsup is that of the voltages greater than voltage Vref which is closest to voltage Vref, and voltage Vinf is that of the voltages smaller than voltage Vref which is closest to voltage Vref. Voltages Vref, Vinf, and Vsup then verify the following equation Eq1:

$$V_{inf} \leq Vref \leq V_{sup} \qquad \text{Eq1}$$

Knowing voltages Vin and Vsup and coefficients Ainf and Asup between these voltages and voltage VDD, for example, equal to Ai for a given voltage Vi, to 1 for voltage VDD, and to 0 for the zero voltage, the following equation Eq2 can be deduced:

$$A_{inf} * VDD \leq Vref \leq Asup * VDD \qquad \text{Eq2}$$

which can also be written in the form of the following equation Eq3:

$$Vref/A_{sup} \leq VDD \leq Vref/A_{inf} \qquad \text{Eq3}$$

This thus provides an estimation of the value of voltage VDD, and more particularly of a voltage range containing voltage VDD. It can be deduced therefrom, for each voltage Vi, whether voltage VDD is greater or smaller than level Vref/Ai, Ai being the coefficient associated with Vi, each voltage Vi defining, with voltage Vref, a voltage having the value of main voltage VDD compared therewith. Further, for each voltage Vi, an estimation of the value of this voltage Vi, and more particularly, a voltage range containing voltage Vi, can also be deduced from equation Eq3 and from coefficient Ai between this voltage Vi and voltage VDD. This is for example advantageous when at least some of the voltages Vi are used as threshold voltages or as power supply voltages of different cells of a circuit.

As an example, for a set of N=7 DC voltages Vi having their value increasing with index i, if voltage Vref is surrounded by voltages Vinf=V4 and Vsup=V5, the value of voltage VDD is between levels Vref/A5 and Vref/A4 and, further, it can be deduced that each voltage Vi is then between (Vref*Ai)/A5 and (Vref*Ai)/A4.

As compared with a method where each of the N voltage Vi would be simultaneously compared with voltage Vref, that is, a method which would not comprise steps 101, 102, and 103, the above-described method enables to decrease the number of voltage comparisons, and thus the number of voltage comparators used in a device implementing the method. The decrease in the number of comparators causes a corresponding decrease in the power consumption of the device and, when the comparators are calibrated, a simplification of the calibration step.

Further, as compared with a method where a reference voltage which is constant independently from the value of voltage VDD would be provided for each voltage level with which voltage VDD is desired to be compared, and where a comparator would be provided for each level, the above described method enables to decrease the number of necessary reference voltages and the number of comparators used.

Figure 2:
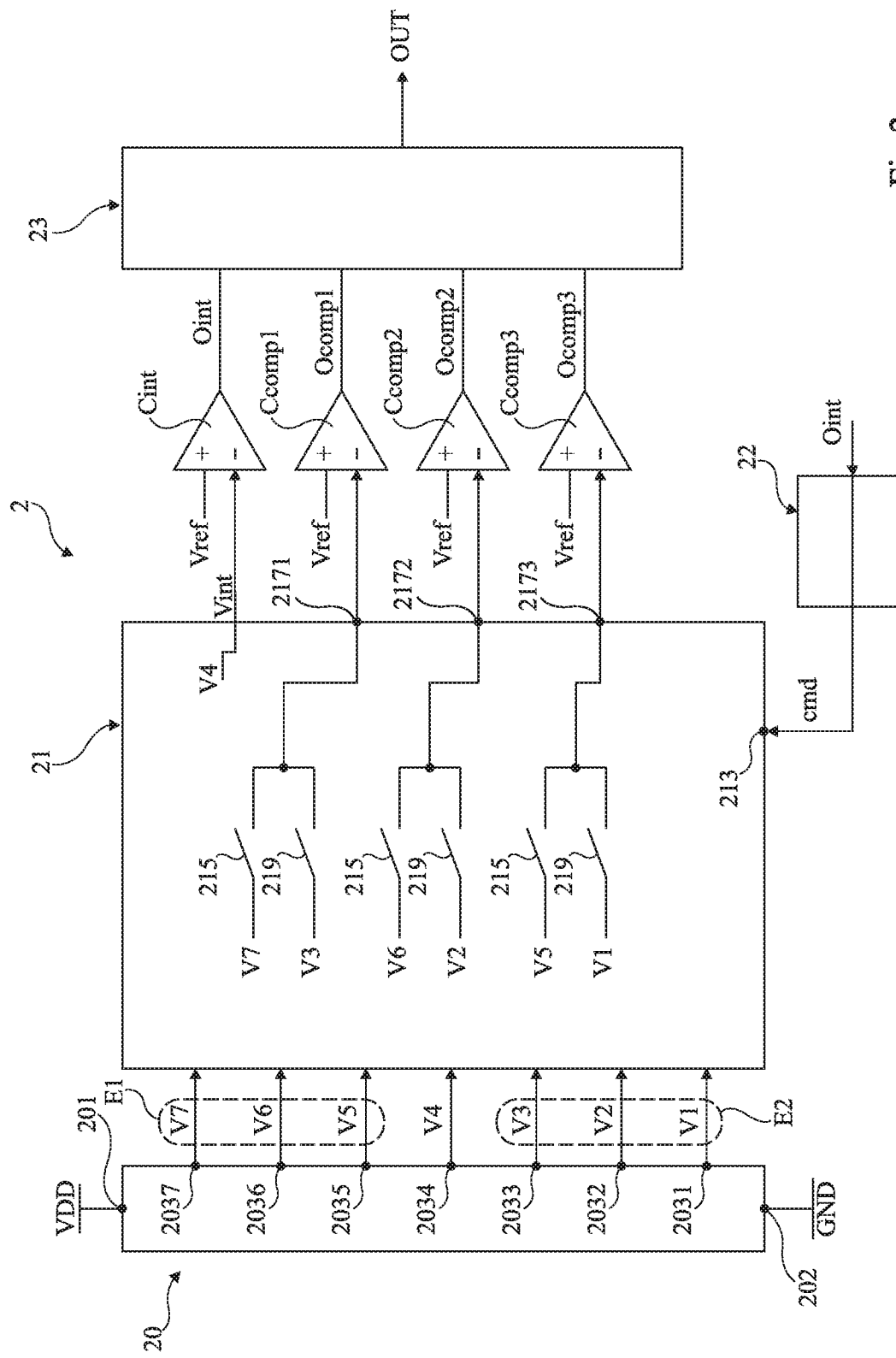
FIG. 2 schematically shows an embodiment of a device of estimation of the value of a DC voltage with respect to a plurality of voltage levels.

FIG. 2 schematically shows in the form of blocks an embodiment of a device 2 of estimation of the value of a main DC voltage VDD with respect to a plurality of voltage levels.

In this example, device 2 is capable of implementing the method of FIG. 1. More particularly, herein, number N of voltages Vi is equal to 7, and a single voltage Vint is selected at step 101.

Device 2 comprises a circuit 20 configured to supply the N DC voltages Vi (step 100, FIG. 1) based on main voltage VDD and, more particularly, in this example, seven DC voltages V1, V2, V3, V4, V5, V6, and V7 having values increasing with index i. Circuit 20 comprises two input terminals 201 and 202 intended to receive voltage VDD. In this example, voltage VDD is positive and referenced to terminal 202, for example, ground GND. Circuit 20 comprises N output terminals 203i, with i varying from 1 to N, each outputting a different DC voltage Vi. Preferably, circuit 20 is a resistive voltage dividing bridge having resistors (not shown in FIG. 2) of known values, having their value deduced, for each voltage Vi, from coefficient Ai.

As a variation, circuit 20 may be external to device 2.

Device 2 further comprises a selection circuit 21 receiving voltages Vi. Circuit 21 selects at least one intermediate voltage Vint from among voltages Vi (step 101, FIG. 1). In this example, circuit 21 selects a single voltage Vint equal to V4. Intermediate voltage Vint here defines two subsets E1 and E2 (in dotted lines in FIG. 2) respectively comprising voltages V5, V6, and V7 greater than voltage Vint, and voltages V3, V2, and Vi smaller than voltage Vint.

Circuit 21 supplies voltage Vint to a comparator Cint, for example, an operational amplifier. Comparator Cint compares the intermediate voltage Vint that it receives with reference voltage Vref (step 102, FIG. 1). As an example, voltages Vint and Vref are supplied to respectively inverting (−) and non-inverting (+) inputs of comparator Cint. Comparator Cint supplies a binary output signal Oint in a first logic state, in this example, '1', if voltage Vref is greater than voltage Vint, and in a second logic state, in this example, '0', otherwise. Preferably, voltage source Vref (not shown) forms part of device 2, although this voltage source may, as a variation, be external to device 2. It will be within the abilities of those skilled in the art to implement such a voltage source.

Circuit 21 also selects, according to signal Oint, one of subsets E1 and E2 (step 103, FIG. 1). More particularly, in this example, circuit 21 selects subset E1 or E2 according to a control signal cmd, for example, received by an input 213 of circuit 21, determined based on signal Oint, for example, by a control circuit 22. In this example, signal cmd is equal to signal Oint and circuit 22 connects the output of comparator Cint to input 213 of circuit 21.

In the shown example, circuit 21 comprises three switches 215 having first terminals receiving respective voltages V7, V6, and V5, and having second terminals connected to respective outputs 2171, 2172, and 2173 of circuit 21. Circuit 21 further comprises three switches 219 having first terminals receiving respective voltages V3, V2, and Vi and having second terminals connected to respective outputs 2171, 2172, and 2173. Switches 215 and 219 are controlled by signal cmd. When voltage Vref is smaller than voltage Vint (Oint equal to '0'), circuit 21 selects set E2 (switches 115 off and switches 119 on), voltages V3, V2, and Vi being then supplied to respective outputs 2171, 2172, and 2173. When voltage Vref is greater than voltage Vref (Oint equal to '1'), circuit 21 selects set E1 (switches 115 on and switches 119 off), voltages V7, V6, and V5 being then supplied to respective outputs 2171, 2172, and 2173.

Circuit 21 supplies voltages Vi of the selected subset E1 or E2 to comparators Ccomp1, Ccomp2, and Ccomp3 connected to respective outputs 2171, 2172, and 2173. Each comparator Ccomp1, Ccomp2, and Ccomp3, for example, an operational amplifier, compares the voltage Vi that it receives with voltage Vref (step 104, FIG. 1). As an example, each comparator Ccomp1, Ccomp2, and Ccomp3 receives a different voltage Vi of the selected subset and voltage Vref on its two inputs, for example, respectively inverting (−) and non-inverting (+), the comparator supplying a binary output signal Ocomp1, Ocomp2, and Ocomp3, in a first logic state, in the present example, '1', if voltage Vref is greater than voltage Vi, and in the second logic state, for example, '0', otherwise.

In this embodiment, device 2 also comprises an output circuit, or decoder, 23 determining, based on signals Oint, Ocomp1, Ocomp2, and Ocomp3, the two voltages Vinf and Vsup surrounding voltage Vref. Preferably, circuit 23 is configured to supply, based on the determined voltages Vinf and Vsup, an output signal OUT representative, for each voltage Vi, of the indication that voltage VDD is greater or smaller than the voltage level Vref/Ai defined by this voltage Vi. This signal is also representative, for each voltage Vi, of a voltage range containing this voltage Vi. Circuit 23 is for example a dedicated circuit (ASIC—Application Specific Integrated Circuit). Circuit 23 may also comprise a microprocessor associated with an instruction memory where instructions are stored, which instructions which, when they are read out by the microprocessor, enable to determine signal OUT.

According to a specific embodiment, not shown, circuit 23 is configured to supply a signal OUT representative, for each voltage Vi, of the fact that voltage Vi is greater or smaller than voltage Vref, for example, a signal over 7 bits where the logic state of each bit indicates whether the voltage Vi corresponding to this bit is or not greater than voltage Vref. Such a signal OUT enables to determine the voltages Vinf and Vsup surrounding voltage Vref and is thus representative of an estimation of the value of voltage VDD with respect to the voltage levels Vref/Ai defined by voltages Vi and, further, for each voltage Vi, of a voltage range containing the value of this voltage Vi. Signal OUT may be totally determined, based on the output signals of the comparators, by means of AND, OR, NOR, and/or NAND logic gates, without using storage elements controlled by a synchronization signal.

In alternative embodiments, not shown, device 2 may be adapted to the case where more than one intermediate voltage is selected at step 101 of FIG. 1. For example, circuit 21 may select three intermediate voltages Vint1, Vint2, and Vint3 (step 101, FIG. 1) respectively equal to voltages V6, V4, and V2 and each defining four subsets of voltages E1, E2, E3, and E4, each respectively comprising voltage V7, V5, V3, and Vi. In this case, device 2 comprises three comparators Cint1, Cint2, and Cint3 (one for each intermediate voltage) and a single comparator Ccomp. As an example of operation of such a device, if voltage Vref is greater than Vint3 and smaller than Vint2 (step 102, FIG. 1), subset E3 is selected (step 103, FIG. 1) and voltage V3 is supplied to comparator Ccomp to determine, according to the result of the comparison of voltage V4 with voltage Vref (step 104, FIG. 1), whether voltage Vref is surrounded with voltages Vsup=V5 and Vinf=V4 or with voltages Vsup=V4 and Vinf=V3.

Figure 3:
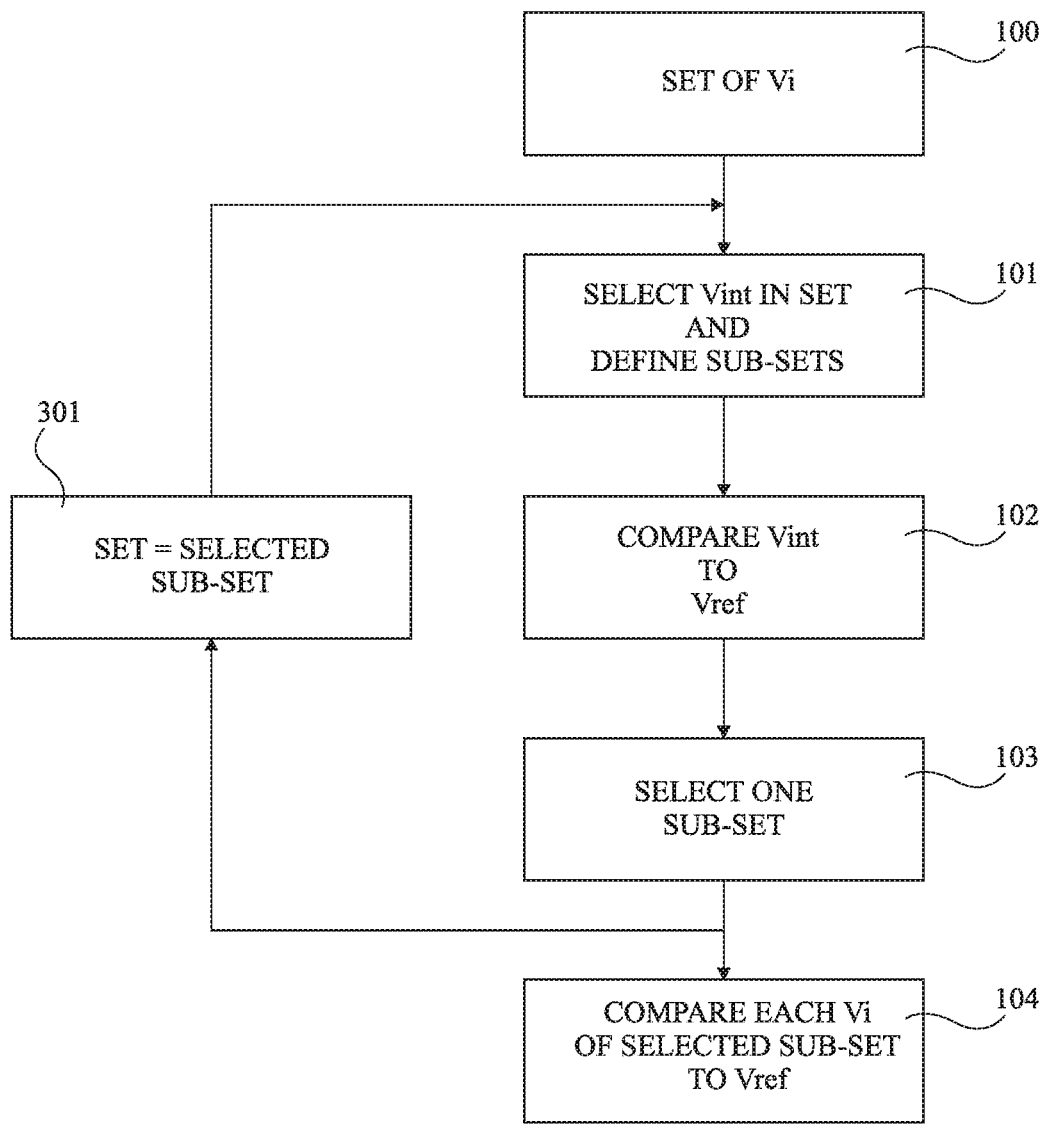
FIG. 3 shows, in the form of blocks, steps of an alternative embodiment of the method of FIG. 1.

FIG. 3 shows, in the form of blocks, steps of an alternative embodiment of the method of FIG. 1.

In this alternative embodiment, it is provided to repeat steps 101, 102, and 103 of the method of FIG. 1. More particularly, the method of FIG. 3 comprises successive steps 100, 101, 102, 103, and 104 described in relation with FIG. 1 and an additional step 301 (block SET=SELECTED SUB-SET) carried out immediately after step 103 and followed by step 101. Preferably, in this alternative embodiment, a single AC voltage Vint is selected for each iteration of step 101.

At step 301, the ordered set of voltage Vi for which steps 101, 102, and 103 will be implemented at the next iteration is selected and corresponds to the subset selected at step 103 of the current iteration. In other words, steps 101, 102, and 103 are repeated recursively.

Steps 101, 102, 103 and possibly step 301 are repeated until the subset selected at the current iteration of step 103 comprises at most a given number of voltages Vi, for example, at most one voltage Vi.

Figure 4:
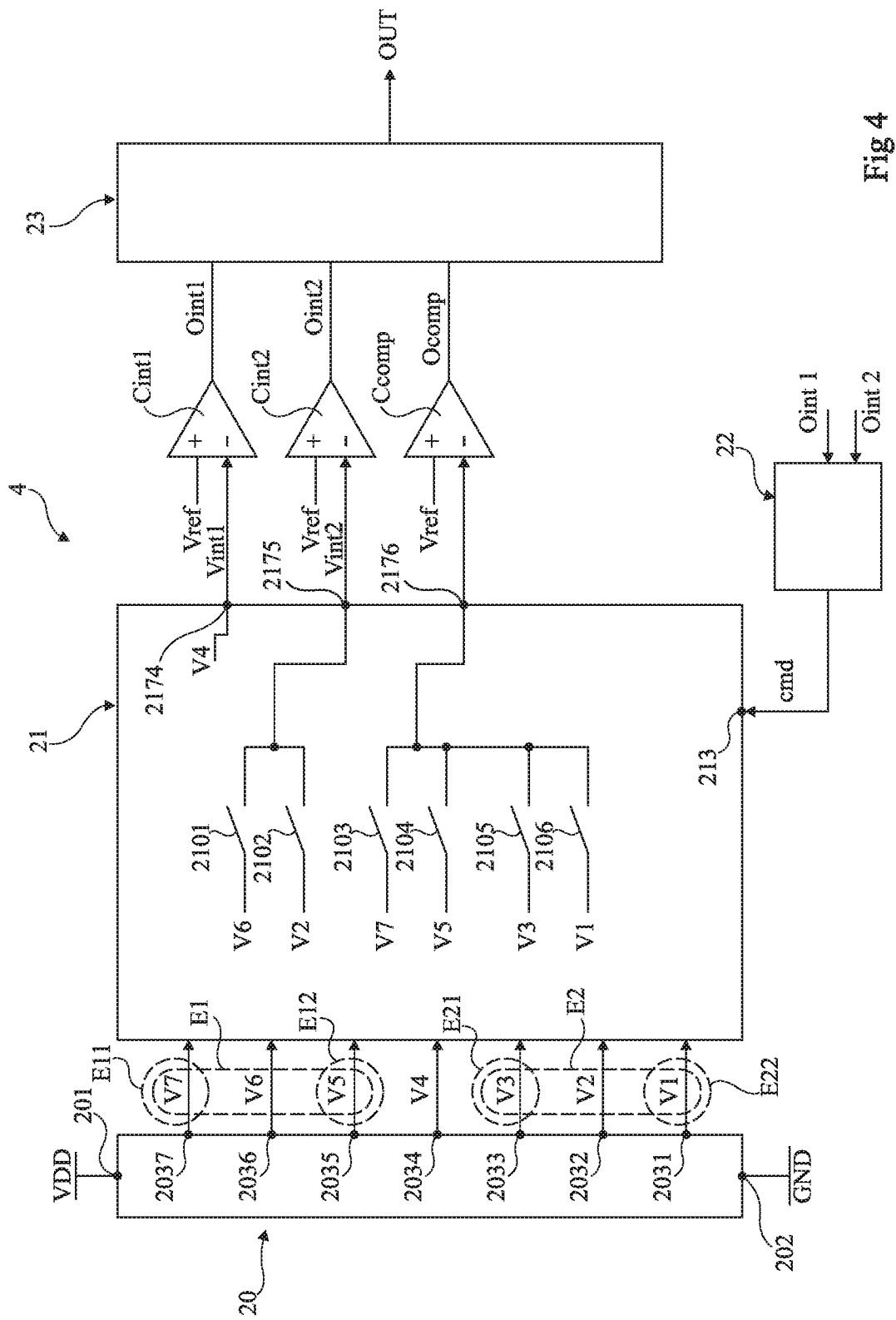
FIG. 4 schematically shows an alternative embodiment of the device of FIG. 2.

FIG. 4 schematically shows in the form of blocks an alternative embodiment of the device of FIG. 2.

In this example, device 4 of FIG. 4 is capable of implementing the method of FIG. 3. More particularly, number N of voltages Vi is equal to 7, a single intermediate voltage is selected at step 101, and steps 101, 102, and 103 are repeated until, at step 103, a subset comprising at most one voltage Vi is selected.

Device 4 comprises, like device 2, circuit 20 for supplying voltages Vi, selection circuit 21, control circuit 22, voltage comparators, and output circuit 23, circuits 21 and 22 of this embodiment being different from those described in relation with FIG. 2.

More particularly, circuit 21 is here configured to select an intermediate voltage Vint1 equal to V4 (first iteration of step 101, FIG. 3). Voltage Vint1 defines two subsets E1 and E2 (in dotted lines in FIG. 4) in the set of the N voltages Vi, subset E1 comprising voltage V7, V6, and V5 greater than the voltage Vint1, and subset E2 comprising voltage V3, V2, and V1 smaller than voltage Vint1.

Instead of outputs 2171, 2172, 2173 and of the output supplying voltage Vint described in relation with FIG. 2, circuit 21 here comprises an output 2174 supplying voltage Vint1 to a comparator Cint1, for example, an operational amplifier. Comparator Cint1 compares voltage Vint1 with voltage Vref (first iteration of step 102, FIG. 3). Voltages Vint1 and Vref are supplied to two inputs, for example, respectively inverting (−) and non inverting (+), of comparator Cint1, the comparator supplying a binary output signal Oint1 in a first logic state, for example, '1', if voltage Vref is greater than voltage Vint1, and in a second logic state, for example '0', otherwise.

Based on signal Oint1, circuit 21 selects subset E1 if voltage Vint1 is greater than Vref, or subset E2 if voltage Vint1 is smaller than Vref (first iteration of step 103, FIG. 3). More particularly, in this example, circuit 21 selects subset E1 or E2 according to the control signal cmd received by its inputs 213, signal cmd being determined at least from signal Oint1, for example, by control circuit 22 which receives signal Oint1 and outputs signal cmd. The selected subset then becomes the ordered set of voltages Vi used for the next iteration of steps 101, 102, and 103 (step 301, FIG. 3).

Circuit 21 then selects an intermediate voltage Vint2 from the selected set E1 or E2 (second iteration of step 101, FIG. 3). In this example, if set E1 is selected, voltage Vint2 is equal to voltage V6 and defines two subsets E11 and E12 (in dotted lines in FIG. 4), set E11 comprising voltage V7 greater than voltage V6 and set E12 comprising voltage V5 smaller than voltage V6. If set E2 is selected, voltage Vint2 is equal to voltage V2 and defines two subsets E21 and E22 (in dotted lines in FIG. 4), set E21 comprising voltage V3 greater than voltage V2 and set E22 comprising voltage Vi smaller than voltage V2.

In the shown example, circuit 21 comprises a switch 2101 connecting output 2036 of circuit 20 to an output 2175 of circuit 21, and a switch 2102 connecting output 2032 of circuit 20 to output 2175 of circuit 21, output 2175 supplying the selected voltage Vint2. According to signal cmd, switches 2101 and 2102 are respectively off and on (Vint2=V2), or respectively on and off (Vint2=V6).

The selected voltage Vint2 is supplied to a comparator Cint2, preferably an operational amplifier. Comparator Cint2 compares voltage Vint2 with voltage Vref (second iteration of step 102, FIG. 3). Voltages Vint2 and Vref are supplied to two inputs, for example, respectively inverting (−) and non-inverting (+), of comparator Cint2, the comparator supplying a binary output signal Oint2 in a first logic state, for example, '1', if voltage Vref is greater than voltage Vint2, and in a second logic state, for example '0', otherwise.

Control signal cmd is also determined from signal Oint2 supplied to circuit 22. Based on signal cmd, circuit 21 selects a subset E11, E12, E21, or E22 (second iteration of step 103, FIG. 3). More particularly, circuit 21 selects subset E11 if voltage Vint1 is greater than voltage Vref and voltage Vint2, then equal to V6, is greater than Vref, subset E12 if voltage Vint1 is greater than voltage Vref and voltage Vint2, then equal to V6, is smaller than voltage Vref, subset E21 if voltage Vint1 is smaller than voltage Vref and voltage Vint2, then equal to V2, is greater than voltage Vref, and subset E22 if voltage Vint1 is smaller than voltage Vref and voltage Vint2, then equal to V2, is smaller than voltage Vref. For this purpose, circuit 21 for example comprises switches 2103, 2104, 2105, and 2106 connecting an output 2176 of circuit 21 to respective outputs 2037, 2035, 2033, and 2031 of circuit 20. According to the control signal, one of switches 2103, 2104, 2105, and 2106 is turned on, the others being left off.

Voltage V7, V5, V3, or Vi of the selected subset, respectively E11, E12, E21, or E22, is supplied to a comparator Ccomp, preferably an operational amplifier. Comparator Ccomp compares voltage Vi of the selected subset E11, E12, E21, or E22 with voltage Vref (step 104, FIG. 3). Voltage V7, V5, V3, or Vi and voltage Vref are supplied to two inputs, for example, respectively inverting (−) and non-inverting (+), of comparator Ccomp, the comparator supplying a binary output signal Ocomp in a first logic state, for example, '1', if voltage Vref is greater than the received voltage V7, V5, V3, or V1, and in a second logic state, for example, '0', otherwise.

Signals Cint1, Cint2, and Ccomp are supplied to circuit 23. Circuit 23 determines output signal OUT, based on the output signals of comparators Cint1, Cint2, and Ccomp.

As an example of operation, if voltage Vref is between voltages V4 and V5, the circuit selects voltage Vint1 equal to V4, subset E1 based on signal Oint1, voltage Vint2 equal to V6 and subset E21 based on signal Oint2, signal Ocomp then indicating that voltage Vref is smaller than V5. It can then be deduced that voltages Vinf=V4 and Vsup=V5 surround voltage Vref.

As compared with the embodiment described in relation with FIG. 2, the device of FIG. 4 comprises less comparators, more particularly one less comparator in these examples where N is equal to 7.

An advantage of circuits 21, 22 and possibly 23 of the described embodiments is that they comprise no storage elements, such as flip-flops, controlled by a synchronization signal. This simplifies the design of the circuits and enables to decrease their power consumption as compared with a device where the circuits would be formed by means of a state machine.

Although embodiments where N is equal to 7 have been described hereabove, it will be within the abilities of those skilled in the art, in the light of the present description, to adapt these embodiments to any number N greater than or equal to 2, preferably greater than 2.

Various embodiments and variations have been described. It will be understood by those skilled in the art that certain features of these various embodiments and variations may be combined, and other variations will occur to those skilled in the art. In particular, the logic states of the various previously-described signals may be adapted by those skilled in the art, particularly in the case where the inverting and non-inverting inputs of at least certain comparators are inverted. Further, these embodiments are compatible with a negative main voltage VDD.

Finally, the practical implementation of the described embodiments and variations is within the abilities of those skilled in the art based on the functional indications given hereabove. In particular, although embodiments and variations where, to estimate the value of DC voltage VDD with respect to different voltage levels, each being defined by the value of reference voltage Vref and by the value of a voltage Vi obtained from voltage VDD, two voltages Vi surrounding voltage VDD are determined, it is within the abilities of those skilled in the art, based on the present description, to implement such an estimation only based on the indication, for each voltage Vi, of whether voltage Vi is greater or smaller than voltage Vref.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method comprising:
    selecting at least one first voltage from among an ordered set of DC voltages, the at least one first voltage defining subsets of DC voltages;
    comparing the first voltage with a DC reference voltage;
    selecting one of the subsets based on a result of the comparing; and
    comparing each voltage of the selected subset with the reference voltage.

2. The method of claim 1, wherein the steps of selecting the at least one first voltage, comparing the first voltage with the DC reference voltage and selecting one of the subsets are repeated before comparing each voltage of the selected subset.

3. The method of claim 2, where the steps are repeated recursively.

4. The method of claim 2, wherein comparing each voltage of the selected subset comprises comparing each voltage of the subset selected at the last iteration of repeated steps.

5. The method of claim 2, wherein the steps are repeated until the at least one first voltage comprise at most one voltage.

6. The method of claim 1, further comprising determining two of the DC voltages surrounding the reference voltage, based on results of comparing the first voltage with the DC reference voltage and comparing each voltage of the selected subset with the reference voltage.

7. The method of claim 6, further comprising estimating a level of each of the DC voltages based on the reference voltage and on the two DC voltages surrounding the reference voltage.

8. The method of claim 6, wherein the DC voltages are obtained from a main DC voltage, the method further comprising estimating the value of the main DC voltage with respect to voltage levels that are each defined by one of the two DC voltages surrounding the reference voltage and by the reference voltage.

9. The method of claim 1, wherein the at least one first voltage defines subsets that comprise the same number of DC voltages plus or minus one.

10. The method of claim 1, wherein selecting one of the subsets based on a result of the comparing comprises selecting only voltages greater than the at least one first voltage or only voltages smaller than the first voltage.

11. The method of claim 10, wherein selecting one of the subsets based on a result of the comparing comprises selecting only voltages greater than the at least one first voltage.

12. The method of claim 10, wherein selecting one of the subsets based on a result of the comparing comprises selecting only voltages smaller than the first voltage.

13. A device comprising:
    a selection circuit configured to select at least one first voltage from among an ordered set of DC voltages, the first voltage defining subsets of DC voltages;
    a first comparator configured to compare the at least one first voltage with a reference voltage;
    the selection circuit being further configured to select one of the subsets based on an output signal of the first comparator; and
    a second comparator configured to compare each voltage of the selected subset with the reference voltage.

14. The device of claim 13, wherein the selection circuit is configured to select a plurality of first voltages and a plurality of subsets defined by the first voltages, wherein the first comparator comprises a comparator for each first selected voltage, and wherein the selection circuit is configured to select the subsets based on output signals of the first comparator.

15. The device of claim 14, wherein the selection circuit and the second comparator are configured to compare the reference voltage with each voltage of a single one of the selected subsets.

16. The device of claim 13, further comprising a voltage generation circuit configured to generate the DC voltages from a main voltage.

17. The device of claim 16, wherein the voltage generation circuit comprises a resistive voltage dividing bridge.

18. The device of claim 13, further comprising a second selection circuit configured to determine, based on output signals of the first and second comparators, two of the DC voltages surrounding the reference voltage.

19. A device comprising:
   means for selecting at least one first voltage from among an ordered set of DC voltages, the at least one first voltage defining subsets of DC voltages;
   means for comparing the first voltage with a DC reference voltage;
   means for selecting one of the subsets based on a result of the comparing; and
   means for comparing each voltage of the selected subset with the reference voltage.

20. The device of claim 19, further comprising means for determining two of the DC voltages surrounding the reference voltage, based on results of comparing the first voltage with the DC reference voltage and comparing each voltage of the selected subset with the reference voltage.

* * * * *